United States Patent [19]

Grolitzer

[11] Patent Number: 4,609,772

[45] Date of Patent: Sep. 2, 1986

[54] PHOTOVOLTAIC PRODUCTS AND PROCESSES

[75] Inventor: Kathy B. Grolitzer, Tarzana, Calif.

[73] Assignee: Columbia Chase Corporation, Braintree, Mass.

[21] Appl. No.: 745,670

[22] Filed: Jun. 17, 1985

Related U.S. Application Data

[63] Continuation-in-part of Ser. No. 526,695, Aug. 26, 1983, abandoned, which is a continuation-in-part of Ser. No. 372,154, Apr. 27, 1982, Pat. No. 4,410,758, which is a continuation-in-part of Ser. No. 234,492, Feb. 17, 1981, abandoned, which is a continuation-in-part of Ser. No. 122,259, Feb. 19, 1980, abandoned, which is a continuation-in-part of Ser. No. 25,224, Mar. 29, 1979, abandoned.

[51] Int. Cl.$^4$ .................... H01L 31/04; H01L 31/18
[52] U.S. Cl. .................... 136/254; 29/572; 252/501.1; 252/62.3 R; 427/39; 427/74; 428/913; 429/111
[58] Field of Search .............. 136/254; 29/572; 148/33, 171; 252/501.1, 62.3 R; 427/39, 74; 429/111; 428/913

[56] References Cited

U.S. PATENT DOCUMENTS

| | | | |
|---|---|---|---|
| 2,076,622 | 4/1937 | DeBoer et al. | 136/254 |
| 2,077,634 | 4/1937 | McMaster | 136/254 |
| 3,089,043 | 5/1963 | Gold | 307/149 |
| 3,284,241 | 11/1966 | Lasser et al. | 136/254 |
| 3,586,640 | 6/1971 | Pershan et al. | 252/501 R |
| 4,024,558 | 5/1977 | Merrin | 357/2 |
| 4,119,768 | 10/1978 | Bayard | 429/111 |
| 4,410,758 | 10/1983 | Grolitzer | 136/254 |

Primary Examiner—Aaron Weisstuch
Attorney, Agent, or Firm—Andrew F. Kehoe

[57] ABSTRACT

A photovoltaic cell and the method of manufacturing the same. The cell includes a substrate of, e.g., of aluminum, having a layer of sulfur-stabilized cesium fluoride-like material with the outer surface thereof containing a P+ boron doped outer layer. A substantially transparent electrically conductive coating is applied over the surface of said cesium fluoride-like material and appropriate electrical contacts are made to the conductive layer for protective purposes.

42 Claims, 5 Drawing Figures 4,609,772

PHOTOVOLTAIC PRODUCTS AND PROCESSES

RELATED APPLICATION

This application is a continuation-in-part of now abandoned U.S. patent application Ser. No. 526,695 filed Aug. 26, 1983 by the instant inventor. That Application was, in turn, a continuation-in-part of U.S. patent application Ser. No. 372,154 filed Apr. 27, 1982, now U.S. Pat. No. 4,410,758. That Application was a continuation-in-part of U.S. patent application Ser. No. 234,492, filed Feb. 17, 1981 and now abandoned. Ser. No. 234,492 was itself a continuation-in-part of U.S. patent application Ser. No. 122,259 filed Feb. 19, 1980 by Grolitzer and now abandoned. Ser. No. 122,259 was a continuation-in-part of Patent Application Ser. No. 25,224 filed on Mar. 29, 1979 and now abandoned. The most recent application was entitled "Improved Photovoltaic Products and Processes". Ser. No. 234,492 was titled "Photovoltaic Products and Processes"; Ser. No. 122,259 was entitled "Improved Photovoltaic Cell"; and the earliest was titled "Photovoltaic Cell".

BACKGROUND OF THE INVENTION

It is becoming increasingly important to provide devices for converting solar energy to electrical energy as sources of organic materials are depleted. The current photovoltaic cells formed of silicon having a PN junction under the surface thereof are expensive to manufacture and rather delicate to operate. For example, these devices must be maintained within rather close temperature tolerances and in the event high temperatures are encountered, the functioning of such devices degrades substantially. Typical prior art devices of the type above referred to are shown and described in U.S. Pat. Nos. 4,001,864; 3,904,453; 3,943,003; 3,977,905 and 4,029,518. Applicant herein is the inventor of the invention described and claimed in U.S. Pat. No. 3,828,186.

It has been a particular problem in the art to provide a high voltage photovoltaic cell, e.g., a cell with a voltage level of, say, 1.5 to 3 or more volts, without sacrificing current generating capacity of the cells. Most photovoltaic materials of the prior art capable of generating even moderately improved voltage output do not respond to relatively low-energy photons, normally plentiful in sunlight, and, as a result, the total current drops substantially. Yet a high voltage is highly desirable to minimize problems and costs associated with coverting the photovoltaic output into external energy distribution systems.

In the invention to be disclosed below, the inventor will describe a photovoltaic cell and a process for manufacturing said cell which results in a more consistently stable and efficient product. Moreover, the inventor discovered a cyclical aspect to the structure, as it is built up in thickness, which discovery is a substantial aid in assuring the efficient manufacture of an efficient cell.

It has heretofore been known to add morphology-stabilizing materials to solid structures to assure a beneficial amorphous character. For example, dextrine has been added to lead acetate and sodium azide during the manufacture of lead azide. The consequent reduction in crystal formation makes the lead azide a much safer material to manufacture and handle. However, it is not believed such earlier work is suggested of the invention disclosed herein.

SUMMARY OF THE INVENTION

A photovoltaic cell including an electrically conductive substrate having a layer of cesium fluoride-like material thereon. Said layer of cesium fluoride-like material includes a P+ doped outer surface layer. A layer of electrically conductive, substantially transparent titanium is located on said layer of cesium fluoride-like material.

OBJECTS OF THE INVENTION

It is an object of the invention to provide photovoltaic material and photovoltaic cells which are readily-formed of inexpensive, widely available chemical components.

It is a particular object of the invention to provide photovoltaic cells which are operative over a wide temperature range and over a wide spectrum of incident radiation.

It is another particular object of this invention to provide a photovoltaic active cell which is more consistently morphologically stable and more easily processed then these cells which are currently available.

Another object of this invention is to provide photovoltaic cells having a more precise cell thickness necessary to obtain a desired cell efficiency for a given thickness range which can be readily ascertained as the cell is being constructed.

A further object of the invention is to utilize and optimize the performance of cesium-based or rubidum-based photovoltaic material.

It is still another object of the invention to provide processes for making cesium-based photovoltaic material.

Other objects of the invention are to provide photovoltaic cells based on the use of cesium or metal in conjunction with atomic reactants such as boron or the like, and fluoride or the like.

Another object of the invention is to provide a photovoltaic cell including an electrically-conductive substrate having a layer of cesium fluoride-like material thereon. Said layer of material, typically, includes a zone containing a P+ doping material. A layer of electrically conductive and substantially transparent titanium overlays said layer of cesium flouride-like material.

It is another object of the invention to provide a method of generating electricity from sunlignt by exposing the cells as described herein to sunlight and collecting the energy thus generated therefrom.

Another object of the invention is to provide a method of manufacturing a photovoltaic cell including the steps of providing an electrically conductive substrate therefor; depositing a layer of metallic cesium thereon, converting said layer of cesium to a cesium fluoride-like material having a p+ doped layer, and evaporating a layer of electrically conductive, substantially transparent conductor adjacent to said layer of cesium fluoride containing a P-type dopant.

Another object of the invention is to provide an improved and inexpensive photovoltaic cell with an unusual combination of high-voltage and high-current output characteristics.

Another object of the invention is to provide an improved photovoltaic cell, one which characterizes a plurality of photovoltaic materials capable of interacting with one another, through a gradient layer in which they are incorporated, to convert a surprisingly broad range of photon energies into photovoltaic energy.

Other objects of the invention will be apparent to those skilled in the art on their reading of this disclosure.

It has been found that cesium is particularly useful when utilized as the basic metal component of a photovoltaic cell. The cesium-bearing photovoltaic material, it is believed, may take any of a number of different forms including a cesium-boride doped with flourine; cesium fluoride doped with boron; and one or more ternary compositions comprising fluorine, cesium and boron. Moreover the specific stoichiometric ratio of elements may differ substantially through the thickness of a photovoltaic layer formed according to the process of the invention.

Rubidium, which is chemically similar to cesium, is also particularly useful as the basic metal component of a photovoltaic cell. It behaves similarly to cesium during the processing of the photovoltaic cells and may be substituted for cesium in this process.

"Doping" as described herein, and as should be obvious to those skilled in the art, is not limited to the use of minute quantities of dopants as used in some semiconductor work, but embraces use of a somewhat greater quantity of dopant which interacts with other components of the photovoltaic layer—to provide or enhance photovoltaic properties. The precise mechanism by which the dopents form means to enhance the product is not fully understood.

One class of photovoltaic products is based upon the reaction, in a plasma environment, of cesium metal and boron, the boron being furnished by any convenient source but conveniently borane gas or boron metal sputtered in an appropriate inert-gas plasma induced by radio frequency (RF). After the cesium-boron reaction product is established, it is convenient to utilize the flourine-type dopant, preferably fluorine itself or in the form of a freon-type gas. The fluorine-bearing gas source is also preferably reacted into the photovoltaic material in a plasma.

Whatever the nature of the reaction product, (or products, as the case appears to be), whether it be a flourine-doped cesium boride, a ternary compound of boron/fluorine/cesium, or a mixture of these, an excellent photovoltaic material is formed.

Under some conditions, it is believed the fluorine will change the original cesium boride compound to a cesium fluoride-like material, the evicted boron acting as another useful component of the photovoltaic cell.

It is noted that cesium boride formed in a crystal furnace is not photovoltaic even if loaded with fluorine in quantities effective to achieve photovoltaic doping according to the present invention.

It has been discovered that partiularly efficient photovoltaic characteristics are formed at depressed temperatures, e.g., temperatures in the range of $-30°$ C. and below. Efficiencies of 11 to 14% have been achieved over short periods of time.

The photovoltaic response of the devices described herein may take place over a broad range of incident radiation ranging from infra-red into the ultra violet range, e.g., from 1 to 0.3 micrometers in wavelength.

It has been observed that cell efficiency is cyclical with respect to cell thickness. That is, as cell thickness is increased from the substrate by deposition of the cesium-fluoride material, the cell will go through a graduated series of maxima and minima levels or relative efficiency. For example, at one micron thickness, a cell with a relative efficiency of e.g. 4% will, upon increasing the cell thickness by about 0.08 microns demonstrate a decrease in efficiency by a factor of about $\frac{1}{2}$. As cell thickness is increased by another 0.08 micron, cell efficiency is expected to exhibit an increase in efficiency by about a significant factor of $\frac{1}{3}$ over the original value of 2%. This cycle will continue in a similar graduated fashion until the increase in efficiency is no longer justified by the time and cost of increasing cell thickness.

Recognizing the cyclical effect of cell thickness on efficiency, it is useful to monitor the relative efficiency of a cell during processing. Thus, this technique will allow one practicing the invention to halt the cell growth process at a thickness level which will correspond to a point near the top of a cyclical maximum of cell efficiency.

It is now possible to achieve more consistently morphologically stable photovoltaic cells, which are more easily processed, by adding trace quantities of sulfur or another element from Group VI A of the Periodic Table. Minute quantities (concentrations less than about 10 parts per million e.g. 4 to 10 parts) in the cesium-fluoride-type material seem to evidence a stabilizing quantity of sulfur has been used. Just prior to the start of cell construction, the sulfur is added to the bell jar by way of a heated filament. The sulfur may be flashed into the system.

Addition of sulfur is somewhat difficult to control in precise quantities. Hydrogen sulfide is highly reactive and tends to react with any fugitive moisture which may enter the system. When using plasma conditions, it has been found to be particularly advantageous to add a gas like sulfur hexafluoride to the reaction chamber with the Freon-gas. In such a case, the flaw of Freon gas is reduced to compensate for the additional fluorine contributed by the sulfur compound.

The $SF_6$ must be pre-dried using, typically, a standard molecular sieve-type desiccant. The $SF_6$ is preferably mixed with argon gas before being introduced into the system. A ratio of 1 part $SF_6$ to 9 parts argon in suitable.

Among useful concentration of sulfur include those of at least 0.005% based on total weight of cesium fluoride-like layer. Higher concentrations appear more desirable than lower concentrations with respect to stabilizing against excessive crystalline growth; but in any event concentration, of up to 0.008% have been demonstrated to be acceptable.

FIG. 5 is a graph illustrating typical gradients of boron concentration in the cesium-fluoride-like material. Both cells exhibit gradients with higher quantities of boron (or an equivalent material) between 1.5 and 2.0% near the top (sun-side) of the material and less than than about 0.2% near the substrate. The graduated material, in each illustrated case, is between about 2000 and 6000 angstroms thick when the gradient ceases.

The cell using the more gradual gradient had an efficiency of about 4.83%; the cell with the steeper gradient had an efficiency of 4.1%.

It is to be noted that the photovoltaic layers of FIG. 5 are graduated not merely in boron content, but also in their physical properties. For example, each cell becomes substantially less crystalline and more amorphous as the boron increases in concentration. It is presently believed that the resulting material represents a group of effective photovoltaic materials capable of connecting photons of different energy characteristics into a high voltage output without any substantial sacrifice in current. This effect, whatever, its cause, may be termed a surprising multiplying effect because it provides a greater energy output from the whole than is presently recognizable to be attributable to any one photovoltaic compound within the cell structure.

ILLUSTRATIVE EMBODIMENTS OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention.

These suggestions herein are selected and included for purposes of illustration in order that others skilled in the art will more fully understand the invention and the principles thereof and will be able to modify it and embody it in a variety of forms, each as may be best suited in the condition of a particular case.

EXAMPLE 1

Figure 1:
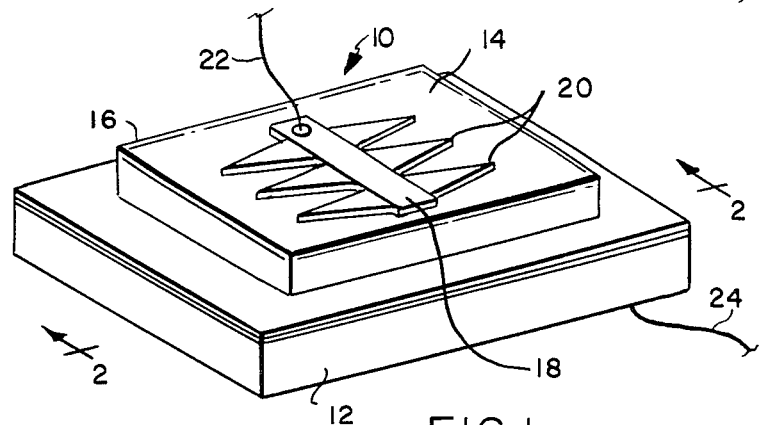
FIG. 1 is a schematic, perspective view of a photovoltaic cell constructed in accordance with the principles of the present invention.

Referring to FIG. 1, a photovoltaic cell constructed in accordance with the principles of the present invention is illustrated schematically at 10 and includes an electrically conductive substrate 12 upon which there is deposited a layer 14 of a cesium fluoride-like compound. A layer 16 of electrically-conductive, substantially transparent metal such as titanium is deposited over the surface of the layer 14. An electrically conductive grid-like network consisting of a center conductor 18 and fingers 20 extending therefrom is applied to the surface of the titanium layer to collect the electrical energy generated by the photovoltaic cell. Electrically conductive leads 22 and 14 are attached to the cell 10 for appropriate use thereof.

Figure 2:
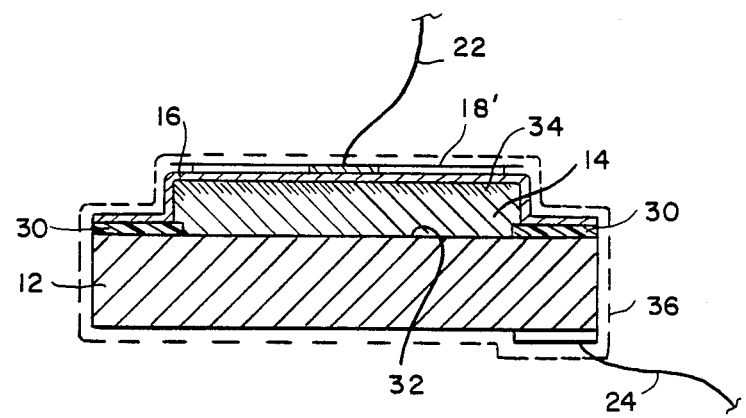
FIG. 2 is a cross sectional view taken on the lines 2—2 of FIG. 1.

As is more clearly illustrated in FIG. 2, the upper surface of the substrate 12 which, for example, may be made of aluminum, is treated to provide a layer of insulating material 30 around the border thereof, thereby leaving an uninsulated or active surface area 32 in the center portion thereof upon which the layer of cesium fluoride-like material 14 is deposited.

The cesium fluoride-like layer 14 is doped with P-type active impurity material, such for example as boron, to provide a highly doped P+ layer 34 adjacent the outer surface of the layer 14. The dopant extends throughout the layer 14 but in only small amounts over the entire body compared to the amount of doping material in the layer 34. The dopant material can be viewed as achieving a graded doping throughout the layer of material 14.

Subsequent to the formation of the device as illustrated in FIGS. 1 and 2, a conformal coating may be applied to the exterior surface as is indicated by the dashed line 36 of FIG. 2, if such is desired. Any type of conformal coating as desired may be utilized, such for example as an acrylic, a polyurethane, or a polyimide type material. Also if desired, the current collecting grid 18–20 may be replaced by NESA type coating over the surface of the titanium layer. The electrical contact 22 would thus be made directly to the Nesa-type (stannous oxide) coating such as illustrated by the numeral 18' in FIG. 2.

The photovoltaic cell, as above described, is generally prepared by electropolishing one surface of an aluminum substrate, preferably prepared of 1100 aluminium alloy. A pressure sensitive mask is applied to the thus polished surface to expose only a uniform border to the thus therearound. The border is then anodically coated by exposure to a standard anodic coating bath under proper conditions for approximately one-half hour. Such anodic coating is well known to those skilled in the art and it is not believed that a detailed description thereof is required herein.

The mask is thereafter removed and the surface of the substrate is recleaned. By specific reference to FIG. 2, the purpose of the anodic coating can be illustrated more clearly. As is therein shown, the layer of titanium metal 16 extends over the entire surface of the cesium fluoride-like layer 14 and onto the upper surface of the substrate 12. Without the anodic layer (which is insulating) the titanium layer would short the upper surface of the cesium fluoride-like layer 14 to substrate 12. Since it is at the upper surface where electrical energy is generated by exposure to photons of light, there would be an immediate short circuit of any electrical energy that might be generated.

Subsequent to the appropriate preparation of the substrate, the remaining portion of the cell is formed by depositing a layer of metallic cesium onto at least the active portion 32 of the substrate 12. The cesium layer is then converted to a cesium fluoride-like material and is dope to provide the P+ type region 34 as above described. Thereafter the titanium layer is thoroughly evaporated onto the exposed surface of the cesium fluoride like layer.

The formation of the cesium layer is true in-situ deposition of cesium which has been provided by reduction of cesium chloride by calcium in a vacuum at approximately 700° C. The cesium layer is then converted by exposing it in a plasma reaction chamber in the presence of a gaseous mixture including a gaseous fluorine compound, an inert carrier and a trace amount of P-type active impurity compound. As is well known to those skilled in the art, the plasma reaction frees the fluorine in the P-type material, permitting a reaction to occur with the cesium, thereby converting the cesium to a cesium fluoride-like material and permitting the dopant material to provide the P+ layer as above described.

The cesium fluoride-like material contains an alkali metal and has a low work function, thus allowing the photon energy to easily dislodge electrons. It is believed that other similar alkali metals such as rubidium and potassium, which also have relatively low work functions, may also work, at least in the sense of augmenting or fine tuning the performance characteristics of the cesium based cell. In any event, it is believed that the material functions as an electron emissive layer. That is, upon receipt of the photon energy there is generated, at the interface between the body of material and the heavily doped surface layer, electrical energy in the form of released electrons.

Thereafter, while still in the chamber, a layer of titanium is thermally evaportad on the surface of the cesium fluoride-like layer.

Figure 3:
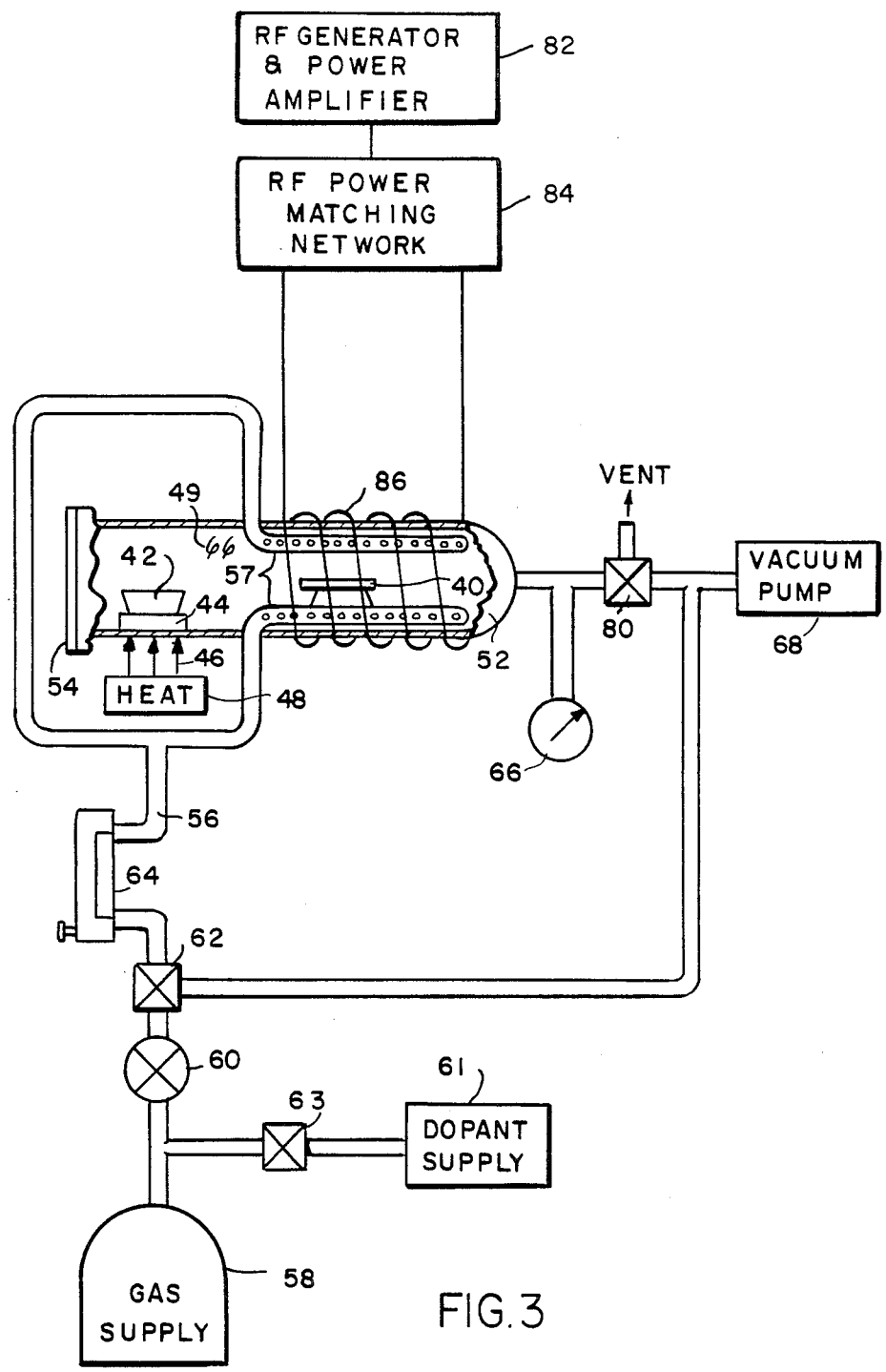
FIG. 3 is a schematic representation of apparatus for constructing the photovoltaic cell in accordance with principles of the present invention.
Figure 5:
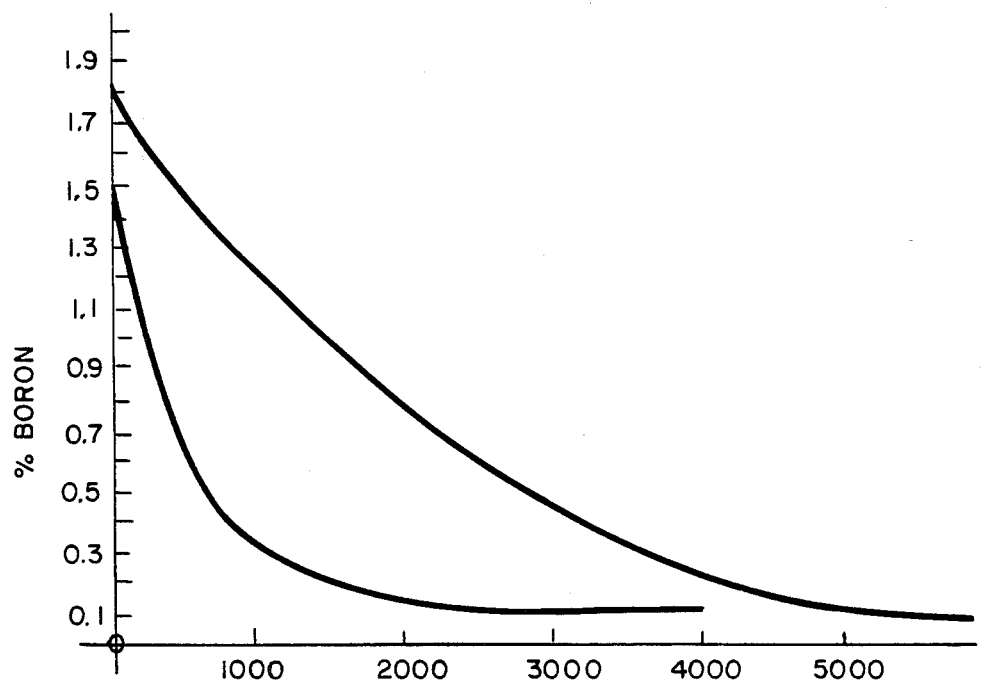
FIG. 5 illustrates typical quantities of boron throughout the depth of a cesium-fluoride-like layer.

Apparatus for carrying out the processes above described would be well known to those skilled in the art. However, for ease of description herein and assistance in complete disclosure, such an apparatus is illustrated in FIG. 3, to which reference is hereby made. As is therein, shown in schematic form, the plasma reactor apparatus includes a reactor chamber 52 typically made of quartz, having a cover 54 and a gas inlet manifold 56. The side of the reactor 52 has been partially broken away to better illustrate gas difusion tubes 57 disposed therein and being externally connected to manifold 56.

Disposed within the chamber 52 is a workpiece 40, such as the substrate above described, which may be supported in any manner desired. A crucible 42 is supported upon a heat conducting base 44 to which heat 46 is supplied form a source 48 thereof.

A pressurized supply of 58 of a binary gaseous mixture comprised of an inert carrier gas such as nitrogen and halocarbon gas is connected through a pressure regulating valve 60, a three way solenoid valve 62 and a flow meter 64 to manifold 56. A pressurized supply 61 of dopant gas such as boron trifluoride is connected through a valve 63 to the output of the gas supply 58. A vacuum gauge 66 provides an indication of total reaction pressure in reactor 52. At any time, and prior to introduction of the gas mixture to manifold 56, the corresponding flow lines are constantly evacuated through the three way solenoid valve 62 leading to the vacuum pump 68. Such is also accomplished where air and atmospheric pressure prevail in reactor 52 through the utilization of three way isloation valve 80. A source of radio frequency power 82 provides exciting energy through a matching network 84 to coil 86 which surrounds reaction chamber 52.

After the substrate of workpiece 40 is loaded into the reaction chamber 52, the crucible 42 is filled with a mixture of cesium chloride and calcium in a ratio of one part cesium fluoride to ten parts calcium. Already provided within the chamber is a source of titanium 49 for evaporation as will be later more fully described. Heat is applied from the source 48 thereof to the contents of the crucible 42 to raise it to a temperature of approximately 700° C. Prior to heating the crucible, the chamber 52 has been evacuated to approximately $10^{-6}$ torr. As a result of such heat a reaction occurs so that the cesium chloride is reduced, thereby freeing the metallic cesium which deposits upon the surface of the substrate 40. Sufficient cesium chloride is provided to cause a deposition to occur upon the substrate 40 of a layer of metallic cesium having a thickness of at least approximately 4000 angstroms. Although at the present time no theoretical upper limit has been found for the thickness of the layer of metallic cesium, it is believed that a maximum thickness on the order of 10,00 angstroms will provide sufficient material and strength for appropriate processing of devices constructed in accordance with the present invention.

Subsequent to the formation of the metallic cesium layer, the solenoid valve 62 is actuated to permit the gaseous mixture from the supply 58 and the dopant supply 61 to flow through this pressure regulator 64 and to the manifold 56. The halocarbon utilized should be selected from the group of organohalides having no more than two carbon atoms per molecule and in which the carbon atoms are attached to a predominance of fluorine atoms. The preferred gaseous mixture is produced from a mixture containing approximately 5000 parts argon and 200 parts Freon 152 gas with approximately 1 part boron trifluoride.

Through the generation in the reaction chamber the fluoro-carbon-based plasma reacts with the exposed cesium layer to combine therewith to thus convert the cesium metal to a cesium fluoride like material of, e.g., about 5000 angstroms thick.

While the plasma reaction is being maintained, the amount of boron trifluoride is linearly increased over a period of approximately seven minutes so as to increase the ratio of the Freon 152 boron trifluoride from 200 to 1 to approximately 200 to 10. In this fashion, resistivity of the cesium fluoride-like material is substantially lowered and the graded doping, above referred to, is obtained with the predominance of boron atoms appearing in the upper surface layer 34 of the layer 14 (FIG. 2).

Throughout the specification and the claims, the term "cesium fluoride-like" material is used. Such term is used since it has been determined that in carrying out the method of the present invention the layer 14 is a non-stoichiometric material having substantially the formula $Cs_xF$, wherein x conveniently varies between about 0.8 and about 1.3 as compared to the amount of the fluorine. Thus the layer 14 is an amorphous material containing cesium and fluorine and exhibiting most of the characteristics of cesium fluoride but does not have the normal stoichiometric formulation thereof. The exact reason for this phenonmena is not at the present time clearly understood, but is believed that the nonstoichiometric relationship of the cesium fluoride like material along with the grading of the boron concentration to provide the heavily doped P+ layer at the surface thereof provides the unexpected and synergistic result of producing electrical energy when exposed to photons. In general, all the preferred photovoltaic materials of the invention have gradients in nonstoichiometric proportion.

Subsequent to the conversion and doping of the metallic cesium layer, the gas and dopant supplies are shut off by activating the solenoid valve 62 and the reaction chamber is again evacuated to approximately $10^{-6}$ torr. Thereafter, the titanium 49 is thermally evaporated in a manner well known to those skilled in the art to provide the titanium layer 16 over the surface of the layer 14. The titanium layer is extremely thin, on the order of 500 angstroms to 2000 angstroms in thickness so as to provide a substantially light transparent layer over the cesium fluoride like layer. It is important that the titanium layer completely cover all of the exposed portions of the layer 14 as is illustrated particularly in FIG. 2. The titanium layer functions not only as a current collector but also as an environmental protection layer to preclude deterioration of the cesium fluoride like layer upon its removal from the reaction chamber 52 and exposure to the atomsphere.

It will be recognized by those skilled in the art that since the titanium layer is extremely thin it presents a very high resistivity layer of electrically conductive metal material for collecting the current operated by the photovoltaic cell. The titanium layer is exposed to the generation of the current over the entire surface of the cesium fluoride like material upon its exposure to photons. However, because of the high resistivity layer this current cannot be efficiently collected by establishing a single portion of contact with the upper surface of the titanium layer. Therefore, the collecting grid network 18-20 is provided so that the current may be collected adjacent the points where it is generated in the photovoltaic cell. The collecting grid may be formed in any manner well known to the art such as by silk screening a coductive ink pattern or through evaporation through an appropriate mask of a conductive material.

After attachment of the leads 22-24 to the structure it may then be coated with the conformal coating as above described to provide additional enviromental protection. The coating may be applied in any manner desired, such as by spraying, painting, dipping or the like of the entire structure into the desired coating material.

EXAMPLE 2

Figure 4:
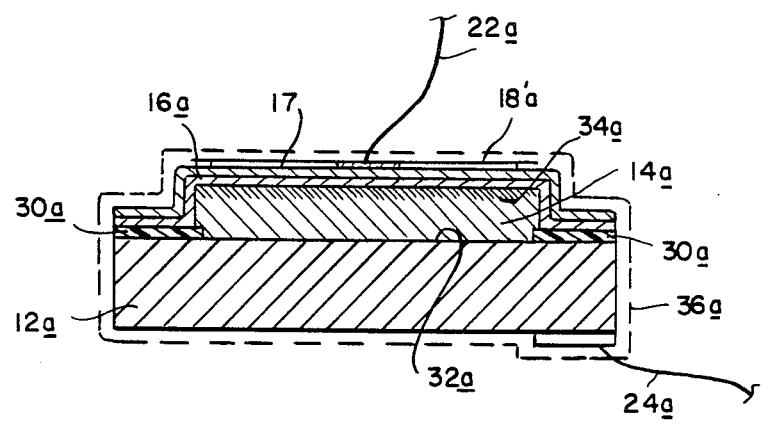
FIG. 4 is analogous to FIG. 2, and shows a preferred form of the invention.

The procedure of Example 1 is repeated except that the titanium barrier layer (layer 16a of FIG. 4) is but 50 angstroms thick. The conductive layer 17 comprises, as shown in FIG. 4, an overlay of indium oxide formed of a 90/10 indium/tin material. The indium oxide is about 1000 angstroms thick; further, it is noted below that layer 16a exists largely as an oxide layer.

The device described above operates well at 400° C. when aluminum is used as a substrate 12. (In general, the devices of the invention are characterized by the ability to operate at high temperatures.) The device has (as did the device of Example 1) an extraordinary property of storing energy. For example, if exposed to sunlight for, say about one to two hours during which x units of photo energy are realized, when measured according to conventional methods, one can remove the device from the sunlight and still, typically, recover 15% to 25% of x units as additional energy at, say a constant 300 microamperes current and 1.5 volts. This latent energy-releasing characteristics appears to be functionally distinct from the primary photovoltaic output of the new apparatus.

Another unique feature of the new photovoltaic material of Examples 1 and 2 is its high output voltage. Voltages of 3 to 3.2 volts have been routinely achieved. These results suggest the apparatus comprises a number of series junctions which may be at least partially explained by the concept that the device comprises a layered glassy structure. In general, it is believed that the steepness of the doping gradient has a beneficial effect on the output voltage and efficiency of the apparatus.

The cesium-bearing layer of the new structure, sometimes referred to herein as being formed of a cesium-fluoride-like layer, has a number of novel and interesting characteristics. For example, although cesium fluoride is a reasonably well-defined compound with distinct hygroscopic properties, the cesium-and fluoride-bearing material of the invention is not the classically stoichiometric material known to the art. It is believed that boron—or other glass formers—can be instrumental in inhibiting crystallite nucleation and thereby increasing the relative amorphous character of the cesium-and-fluoride material in the layer, or layers, thereof which bear sufficient boron to so function.

In the device disclosed herein, the conductive layer is preferably transparent. In order to achieve transparency to the visible spectrum of about 90% to 96% or more, it is desirable to utilize a non-metallic conductor. Indium oxide is entirely suitable. Indeed, a coating formed by sputtering a commercially-available material of 10:90 tin-to-indium ratio is suitably used. The material is well known to the sputtering art and forms an oxygen-deficient oxide coating with good current carrying capacities. The sputtering can be carried out according to maniupulative techniques already well known in the art. For example, the layer may be deposited under direct current or radio-frequency plasma conditions in an atmosphere of about 90% argon and 10% oxygen. The cathode used in sputtering could consist of indium. However, a 90% indium and 10% tin oxide dispersion also works well if the cathode is maintained below the melting point of the alloy. In making a device as described herein, the device to be coated may be spaced, say, 5 cm. above the dark side of the cathode. The sputtering may take place at an absolute pressure of about 40 microns. Coating thickness can vary over a wide range, e.g., from 1000 angstroms to a micron.

EXAMPLE 3

Process for First Cesium Boride Photovoltaic Cell

As in Examples 1 and 2, the substrate may consist of an aluminum substrate which has been electropolished and suitably masked and anodized. The substrate is placed in the vacuum system (bell jar, etc.). A charge of cesium chloride and calcium metal is placed in an electrically heated boat under the substrate, as in Example 1. The vacuum system is pumped (exhausted) to approx. 50 microns vacuum for a plasma cleaning step, which enhances but is not necessary for further procedures.

The system is then pumped to the low $10^{-6}$ torr region. The in situ reduction of cesium chloride to metallic cesium by heating the boat, as in Example 1 occurs. The cesium evaporates and coats the substrates. The coating thickness is approx. $10^{-1}$ microns but is not critical. When the substrate reaches approx. 20° C. (room temp.) a stream of a mixture of approx. 5% borane and 95% argon gas is admitted into the system at a flow rate to maintain approximately 5 micron system pressure. The pressure does not appear to be critical. The reaction to cesium boride appears to be very rapid, in the order of seconds, however, the gas is allowed to flow for several minutes.

The gas flow is stopped, system pressure is allowed to return to the $10^{-6}$ torr region (not critical but to remove residual borane). A mixture of 1% freon in argon is admitted into the system to produce a pressure of approximately 50 microns. As in Example 1 a suitable radio frequency plasma is established. The conditions are maintained for about 5 minutes, during which time the substrate temperature is allowed to rise to roughly 250° C. All gas flows are stopped.

The system is pumped to approx. $3 \times 10^{-6}$ torr and conductive coatings similar to Examples 1 or 2 are applied. The first (and only) cell showed an open circuit voltage of 0.71 volts under approximately 1 sun (solar simulator; air mass 1). The internal resistance was approx. 34 Ohms. The efficiency was approximately 1.08%.

The internal storage characteristic seemed to be absent (no storage battery effect). The fluorine "doping" appears to be critical. This cell seems to follow classical semiconductor behavior more closely than previous cells. The band gap voltage is more closely matched to the average energy of solar radiation (approx. 1.3 eV) than previous cells.

The term borane is used to describe a class of boron hydrides. In our particular case the compound diborane ($B_2H_6$) was used. The diborane was synthesized from $LiAlH_4$ and $BF_3$.

EXAMPLE 4

The procedure of Example 3 was repeated substituting rubidium for cesium. The resulting material exhibited photovoltaic properties.

Referring again to the conductive oxide coating used as an electrical conductor in Example 2, it has been found advantageous to have a material interfacing between the aforesaid conductive oxide and the underlying cesium-bearing material. The interfacing material is advantageously achieved by depositing a thin layer of titanium on the cesium-bearing material. Zirconium may be used to replace the titanium layer. The titanium, especially when used in ultra-thin layers, will, to a large extent, become oxidized to titanium oxide and the oxide itself may be viewed as a barrier material. The thickness of this layer need not be great. It need be sufficient only to form a continuous film over the area of interest. Indeed, only an interfacial coating is required, and it may be but 6 to 10 atoms thick. In practice, the coating will usually average between 20 and 100 angstroms. A given interfacial coating may vary very substantially in thickness, often by a 20 to 1 ratio without much affecting the performance characteristics of the completed device.

It appears that the titanium interfacial barrier layer tends to minimize electron trapping. It is most efficiently used on the side of the photovoltaic material facing the incident radiation, but it also of value at the interface more remote from the incident radiation. In any event, it appears to provide a superior bonding of the overlayering oxide, e.g., indium oxide, to the cesium-bearing substrate and thus facilitates transfer of energy at the interface.

The cesium-bearing material of the invention is largely amorphous in character although it does exhibit some limited amount of an X-ray diffraction pattern and, in that sense, can differ from such amorphous materials as newly-manufactured window glass and the like. It is believed that in the art, that such materials have been called polycrystalline in order to distinguish over the clearly crystalline nature of the silicon "single-crystal" materials which are well known, and even dominant, in the photovoltaic field.

The method of the present invention allows rapid production of photovoltaic cells constructed in accordance therewith. This is particulary important in large scale, continuous-flow, production lines. The entire time required to desposit the cesium, convert and dope it, and provide the conductive layer is approximately twenty minutes, including pump-downtime and may be reduced substantially on automated equipment. The structure as provided has also been found to have high temperature resistance and thus is extremely useful in applications where relatively high temperatures will be encountered.

One advantage of the present photovoltaic systems is that they may be made extemely thin and consequently can be made faster. In general, it is believed that relatively steep boron concentration gradients are beneficial in producing a photovoltaic cell which is very thin. On the other hand, it is believed that optimum efficiencies for most applications will be with thicker photovoltaic layers, e.g., layers which are from about 6000 angstroms to 2 micrometers in thickness. It appears that a higher boron concentration can be utilized in the topmost zones of the graduated material as the thickness increases. Also, as indicated above, the gradient may be reduced, as thicker cells are produced, to approximate a straight line or, at least, a segment of the circumference of a large circle.

The photovoltaic materials of the invention have demonstrated long term stability at 200° C., and have shown useful photovoltaic activity for a few hours as high as 400° C.

It is believed that other P+ materials such as lithium compounds and the like, glass formers such as lanthanum and the like, or even carbon can be substituted, at least in part for the boron.

It is also to be understood that the following claims are intended to cover all of the generic and specific features of the invention herein described and all statements of the scope of the invention which might be said to fall therebetween.

What is claimed is:

1. A composition of matter comprising a solid photovoltaically active product of cesium, boron and fluoride comprising a morphology-stabilizing quantity of a Group VI A element.

2. A photovoltaic cell which comprises:
   (A) an electrically conductive substrate;
   (B) a layer of cesium fluoride-like material on one surface of said substrate, said layer containing first and second portions, said first, lower portion adjacent said substrate being non-stoichiometric cesium fluoride-like material, and said second, upper portion being non-stoichiometric cesium fluoride-like material having a highly doped P+ doping, the transition between said first and second portions being graded with respect to said doping;
   (C) an electrically conductive substantially transparent metallic layer over said upper portion of said cesium fluoride-like layer; and
   (D) a morphology-stabilizing quantity of a Group VI A element, within said layer of said cesium fluoride-like material.

3. The photovoltaic cell as defined in claim 2 wherein said Group VI A element is sulfur.

4. The photovoltaic cell as defined in claim 2 wherein said layer of cesium fluoride-like material is approximately 5000 angstroms in thickness.

5. The photovoltaic cell as defined in claim 4 wherein said electrically conductive substantially transparent metallic layer is titanium.

6. The photovoltaic cell as defined in claim 5 wherein said titanium layer is approximately 500 angstroms in thickness.

7. The photovoltaic cell as defined in claim 6 which includes a transparent protective coating over said titanium layer.

8. A photovoltaic cell comprising:
   (A) an electrically conductive substrate;
   (B) an overlying layer of photon-responsive electron emissive material comprising a sulfur-stabilized alkali metal fluoride-type compound having a low work function and having a concentration of a P-type dopant at its upper surface; and
   (C) an electrically conductive substantially transparent metallic layer contiguous with the surface of said electron emissive layer.

9. Apparatus for generating electricity from sunlight comprising:

(A) an electrically conductive substrate;
(B) an overlying layer of a photon-responsive electron emmisive material morphologically stabilized with a Group VI A element, comprising an alkali metal fluoride-type compound having a low work function and having a concentration of P-type dopant at its upper surface; and
(C) an electrically conductive substantially transparent metallic layer contiguous with the surface of said electron emissive layer.

10. A process of generating electricity from sunlight, comprising providing a photovoltaic cell including an electrically conductive substrate having a sulfur-stabilized layer of photon activated electron emissive material of an alkali metal fluoride-type compound having a low work function and including a heavily doped P+ outer surface layer with a layer of electrically conductive substantially transparent material thereover; exposing said cell to sunlight, and collecting the electrical energy generated by exposure of said cell to said sunlight.

11. The process of claim 10 wherein said cell is subjected to temperatures above 400° C. during operation.

12. In a photovoltaic cell comprised of the type including an electrically conductive substrate upon which a photo-responsive element is placed an an electrically conductive transparent superstrate under which said photo-responsive voltage-generating element is placed, and said superstrate and said substrate forming terminals from which photovoltaic energy generated by said photo-responsive element may be collected, the improvements wherein said element is formed of
(A) P+ doped, cesium-fluoride-like material or P+ doped, rubidum-fluoride-like material and
(B) a thin layer of metal oxide forming electrontrapping means between said cesium-fluoride-like material or said ribidium-fluoride-like material and said superstrate,
and wherein said material (A) is morphologically stabilized with trace quantities of sulfur.

13. A photovoltaic cell as defined in claim 12 wherein said P+ doped cesium-fluoride-like material is stabilized with sulfur and comprises a doping gradient therein.

14. A photovoltaic cell as defined in claim 13 wherein said P+ dopant is boron.

15. A photovoltaic cell as defined in claim 14 wherein said cell forms energy-storage means.

16. A photovoltaic cell as defined in claim 13 wherein said cell forms energy-storage means.

17. A photovoltaic cell as defined in claim 12 wherein said P+ dopant is boron.

18. A radiant-energy activated electrical storage battery comprising a cesium fluoride-like layer containing a glass-forming, P+ dopant and comprising means to permit electrons to flow into and out of said layer and an electron trap means in contact with said layer to assure that a quantity of energy is stored in said storage battery after activation by radiant energy.

19. A process for making a photovoltaic material comprising reacting cesium or ribidium in a plasma environment with
(A) a sequence of boron and fluorine or a sequence of fluorine and boron; and
(B) a stabilizing quantity of an element from Group VI A of the periodic table; and thereby forming a coating of said photovoltaic material.

20. A process as defined in claim 19 wherein said reaction is carried out on a cesium substrate at a temperature of −30° C. or below.

21. A process as defined in claim 19 wherein said stabilizing element is sulfur and wherein said sulfur is introduced as a gaseous compound of sulfur and fluorine.

22. A process as defined in claim 21 wherein said gaseous compound is $SF_6$.

23. A process for making a photovoltaic material comprising the steps of reacting cesium with boron and fluorine in a plasma environment and stabilizing the photovoltaic material with trace quantities of a Group VI A element.

24. A process as defined in claim 23 wherein a relatively large portion of boron is initially reacted with a layer of said cesium in the presence of some fluorine reactant to form a layer that is primarily boron and cesium and, thereafter, reacting with an increased amount of fluorine with the upper portion of said boron-cesium layer.

25. A process as defined in claim 23 wherein a relatively large portion of fluorine is initially reacted with a layer of cesium to form a layer that is primarily fluorine and cesium and, thereafter, reacting boron with the upper portion of said boron-fluorine layer.

26. A process as defined in claim 25 wherein said reaction is carried out on a cesium substrate at a temperature of −30° C. or below.

27. A process as defined in claim 23 wherein said reaction is carried out on a cesium substrate at a temperature of −30° C. or below.

28. The method of manufacturing a photovoltaic cell comprising:
(A) providing an electrically conductive substrate;
(B) depositing a layer of alkali metal material having a low work function on said substrate;
(C) converting said layer of metallic material to an alkali metal fluoride-like material;
(D) doping said layer with a P-type active impurity to provide a highly doped P+ region at the outer surface thereof;
(E) terminating the thickness of said layer near a thickness point at which said cell exhibits a maximum in efficiency, said maximum being at least the second maximum in a series of maxima and minima; and
(F) evaporating a layer of electrically-conductive substantially light transparent material over the entire surface of said layer.

29. The method of claim 28 wherein said alkali metal material is cesium and is deposited by the insitu reduction of cesium chloride in a vacuum of approximately $10^{-6}$ torr in the presence of calcium.

30. The method of claim 28 wherein said alkali metal material is fluoride-doped cesium and is deposited with a stabilizing quantity of sulfur incorporated therein by decomposition of a fluorine containing gas.

31. The method of claim 30 which further includes maintaining plasma conditions during said decomposition of said fluorine containing gas.

32. The method of clain 31 wherein said layer of converted metallic cesium is approximately 4000 angstroms to 10,000 angstroms thick.

33. The method of claim 32 wherein said layer of electrically conductive transparent material is titanium.

34. A process as defined in claim 31 wherein said fluorine-containing gas comprises a sulfur-bearing component forming means to stabilize said fluoride-doped cesium.

35. A process as defined in claim 34 wherein said sulfur-bearing component in $SF_6$.

36. The method of claim 28 wherein said light-transparent material is a coating comprising a conductive oxide over a thin barrier layer of metal oxide forming an electron trapping means.

37. The method of claim 36 wherein said metal oxide is titanium oxide.

38. The method of claim 28 comprising the step of forming said alkali metal fluoride-like material as a glassy material.

39. The method of claim 38 wherein said P-type active impurity is boron.

40. A sulfur-stabilized photovoltaically active material comprising cesium or rubidium, boron and fluoride in a sheet material and wherein crystallinity of said sheet material decreases as the quantity of boron increases through the thickness of said sheet.

41. A photovoltaically active material as defined in claim 40 characterized by a stable photovoltaic conversion efficiency of at least 4% and a voltage output in excess of 1.5 volts.

42. A photovoltaic material as defined in claim 40 wherein the photovoltaic material is less than about 5000 angstroms thick.

* * * * *